(12) United States Patent
Foley et al.

(10) Patent No.: US 8,102,002 B2
(45) Date of Patent: Jan. 24, 2012

(54) SYSTEM AND METHOD FOR ISOLATED NMOS-BASED ESD CLAMP CELL

(75) Inventors: David Foley, Chelmsford, MA (US); Haiyang Zhu, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 169 days.

(21) Appl. No.: 12/534,988

(22) Filed: Aug. 4, 2009

(65) Prior Publication Data

US 2010/0148266 A1 Jun. 17, 2010

Related U.S. Application Data

(60) Provisional application No. 61/122,855, filed on Dec. 16, 2008.

(51) Int. Cl.
*H01L 23/62* (2006.01)
(52) U.S. Cl. ........ 257/360; 257/361; 257/362; 257/363; 257/E27.016; 257/E27.017
(58) Field of Classification Search .................. 257/360, 257/361, 362, 363, E27.016, E27.017
See application file for complete search history.

(56) References Cited

U.S. PATENT DOCUMENTS

| | | | | |
|---|---|---|---|---|
| 6,215,135 | B1 * | 4/2001 | Schroder | 257/173 |
| 7,403,363 | B2 * | 7/2008 | Mandai | 361/58 |
| 7,741,680 | B2 * | 6/2010 | Zhu et al. | 257/357 |
| 2002/0145164 | A1 * | 10/2002 | Kunz et al. | 257/360 |
| 2002/0195648 | A1 | 12/2002 | Hirata | |
| 2004/0251484 | A1 * | 12/2004 | Miyazaki et al. | 257/299 |
| 2007/0096793 | A1 * | 5/2007 | Kato et al. | 327/524 |
| 2008/0029820 | A1 | 2/2008 | Disney et al. | |
| 2010/0038718 | A1 * | 2/2010 | Zhu et al. | 257/357 |
| 2011/0012196 | A1 * | 1/2011 | Williams et al. | 257/343 |

OTHER PUBLICATIONS

International Search Report dated Jan. 27, 2010, in counterpart international application No. PCT/US2009/066984.

\* cited by examiner

*Primary Examiner* — Ngan Ngo
(74) *Attorney, Agent, or Firm* — Kenyon & Kenyon LLP

(57) ABSTRACT

The invention is directed to a protection circuit for protecting IC chips against ESD. An ESD protection circuit for an integrated circuit chip may comprise an isolated NMOS transistor, which may comprise an isolation region isolating a backgate from a substrate, and a first and second doped regions and a gate formed on the backgate. The ESD protection circuit may further comprise a first terminal to connect the isolation region to a first electrical node, and a second terminal to connect the second doped region to a second electrical node. The first electrical node may have a higher voltage level than the second electrical node, and the gate and backgate may be coupled to the second terminal.

10 Claims, 11 Drawing Sheets

SYSTEM AND METHOD FOR ISOLATED NMOS-BASED ESD CLAMP CELL

CROSS-REFERENCE TO RELATED APPLICATIONS

This application claims priority to U.S. Provisional Patent Application No. 61/122,855, filed Dec. 16, 2008, entitled "Isolated NMOS-Based ESD Clamp Cell," which is herein incorporated by reference in its entirety.

BACKGROUND

The present invention is generally directed to a protection of integrated circuits (ICs) against electrostatic discharge (ESD). In particular, the present invention is directed to a device and method for protecting ICs against ESD using an isolated NMOS transistor.

Integrated circuit (IC) chips are made from semiconductor materials such as silicon and insulating materials such as silicon dioxide. Static charges may build up on exposed terminals (e.g., pins) of an IC chip. These static charges remain on those terminals of the IC chip until either bleed off to ground or are neutralized by a discharge. ESD is a sudden and momentary electric current that flows between two points with opposite charges. Internal circuitry of IC chips may suffer damage due to ESD. In order to prevent the damage, exposed terminals of the IC chips may be provided with a protection circuit to conduct ESD current when there is static charge build up.

One type of transistor for an IC chip are metal-oxide-semiconductor field-effect (MOS FET or MOS) transistors. MOS transistors operate by forming a channel between two doped regions (e.g., source and drain) and conducting electrical current via the channel by a certain electrical carrier (e.g., n type (electrons) or p type (holes)). Based on the types of the carrier, a MOS transistor may be termed as an NMOS-FET (e.g., a n type MOS) or a PMOSFET (e.g., a p type MOS) (also commonly referred to as NMOS, PMOS). The channel of a MOS transistor is controlled by a gate, which normally uses a silicon oxide film (also referred to as the gate oxide film) as an insulating film to separate the gate and the channel. Because MOS transistors use only one type of electrical carrier, they may be termed as unipolar transistors. In contrast to MOS transistors are bipolar transistors, which operate by conducting electrical current using both types of electrical carriers (e.g., electrons and holes).

In one type of MOS transistors, the two doped regions are formed directly on a substrate with an opposite electrical carrier (e.g., p type regions on a n type substrate or n type regions on a p type substrate). For example, an NMOS transistor may be manufactured by forming two n type doped regions on a p type substrate and a gate of silicon oxide film over the channel between the two n typed doped regions. This type of MOS transistor typically is used with a low operational voltage (e.g., ±2.5 volts, or ±1.5 volts).

In another type of MOS transistor, called "isolated" NMOS or PMOS transistors, the two doped regions may be formed on a backgate layer, which is isolated from the substrate layer by an isolation layer. The backgate layer and the substrate have same type of electrical carrier and the isolation layer has an opposite electrical carrier. Isolated NMOS or PMOS transistors can have a relatively wider range of operational voltage (e.g., ±12 volts or ±15 volts).

FIG. 1 shows a cross section of a conventional isolated NMOS transistor 100. In the isolated NMOS transistor 100, an n type isolation region 104 isolates the p type backgate 106 from the p type substrate 102. Two n type doped regions 108 and 110 form the drain and source of the NMOS transistor. A gate 112 is formed between the drain 108 and the source 110. The backgate 106 contains a doped region 114 to connect the backgate 106 to a terminal. A doped region 116 of the substrate 102 may connect the substrate 102 to another terminal (e.g., ground). In a symmetrical isolated NMOS transistor, the drain 108 and the source 110 are interchangeable.

Although the isolated NMOS transistor 100 is designed as an MOS transistor, in effect, three parasitic npn bipolar transistors labeled T1, T2 and T3 are formed. These bipolar transistors operate by involving both negative and positive electrical carriers (e.g., electrons and holes). The n type isolation region 104 forms the collectors of both T1 and T2, while the p type backgate 106 forms the bases of both T1 and T2. The drain 108 forms the emitter of T1, while the source 110 forms the emitter of T2. T3 is formed by the drain 108 as the collector, the backgate 106 as the base and the source 110 as the emitter.

During manufacturing, assembly, installation and/or operation of an IC chip, static charges may accumulate on external terminals (e.g., pins) of the IC chip. The isolated NMOS transistor 100 may be used to connect the IC to some external circuits (e.g., power supplies, signals). If there is static charge build up on those external terminals, different regions of the isolated NMOS transistor 100 may reach different potential levels. The different potential levels between different regions may create electrical stresses (e.g., ESD stress) across those regions and cause the parasitic bipolar transistors to break down in both the forward and reverse directions. For example, when a positive ESD stress as measured from the collector to the emitter is applied (e.g., from the isolation region 104 to the drain 108 for T1, from the isolation region 104 to the source 110 for T2, from the drain 108 to the source 110 for T3), the parasitic npn transistors T1, T2, and T3 may break down in the forward direction. In this kind of breakdown, an electron avalanche is created at a reverse biased collector base junction, a drifting of holes raises the backgate 106's potential, and the emitter diode becomes forward biased. This causes the bipolar transistor to enter a state referred to as "snapback" as it conducts the ESD current. For example, the ESD stress may be formed across the drain 108 (e.g., collector of T3) and the source 110 (e.g., emitter of T3). The junction of the drain 108 and the backgate 106 may become reverse biased, and an electron avalanche is created at this junction. A drifting of holes from the drain 108 towards the backgate 106 raises the potential of the backgate 106 and makes the backgate 106 to the source 110 diode become forward biased. Thus, T3 enters the snapback state and conducts the ESD current.

Protection circuits have been developed to protect IC chips from ESD. For example, an IC chip may be protected by a conventional NMOS transistor ESD protection circuit 200 as depicted in FIG. 2. The conventional NMOS transistor ESD protection circuit 200 may be termed as a "clamp cell" or "breakdown cell". The conventional NMOS transistor ESD protection circuit comprises a single isolated NMOS transistor 100 with the gate 112 coupled to source 110 and backgate 106. As shown in FIG. 2, both of the source 110 and the backgate doped region 114 are connected to a terminal 2. The gate 112 is coupled to the terminal 2 via a resistor 220. The isolation region 104 is connected to a terminal 1 via a resistor 230 placed in series. The drain 108 is connected to a terminal 3. There is no resistor between the source 110 and the backgate doped region 114 and these two regions will maintain the same voltage at all times. During normal operations of the NMOS transistor, no electrical current flows between the terminal 2 and the gate 112, thus, the gate 112 and the source 110 will be kept at the same voltage level and the NMOS transistor will be off (e.g., an OFF-NMOS).

If static charges accumulate on either of the terminals, an ESD event may occur to discharge the static charges or neutralize them. During an ESD stress from the drain 108 to the source 110, in which the isolation region 104 (e.g., terminal 1) acts as an open circuit, this ESD protection circuit functions due to the breakdown of transistor T3. During the ESD event, the resistor 230 can limit the current that flows to the isolation region 104 because any electrical current flowing to terminal 1 will raise the potential level at the isolation region 104. Thus, the resistor 230 may reduce the potential difference between the drain 108 and the isolation region 104 and steer the ESD current away from the isolation region 104. Accordingly, even an ESD stress may take place across the drain 108 and the isolation terminal 1, the resistor 230 helps to prevent the damage that can occur if a large current flows from the drain 108 to the isolation terminal 1.

This OFF-NMOS ESD protection circuit be found between two power supply pins on an IC chip. For example, the terminal 3 may be connected to the high potential power supply $V_{DD}$ (e.g., positive (+) 12 volts) and the terminal 2 may be connected to the low potential power supply (e.g., negative (−) 12 volts). The terminal 1 may be connected to $V_{iso}$, which may be grounded or a $V_{SS}$ (e.g., 3.3 volts).

One tool to analyze ESD effects on IC chips is transmission line pulse (TLP). TLP shows the quasistatic I/V characteristic of IC chips by applying electrical pulses with a variety voltage levels. Example TLP curves of the conventional NMOS ESD protection circuit 200 (e.g., an ESD clamp cell from a 24V CMOS process with isolated NMOS devices) are shown in FIG. 3, which includes an I/V curve 302 for ESD pulse and a curve 304 for leakage current after applying ESD pulses. Each point for the curve 302 may be obtained by applying a pulse (e.g., a fixed time period) with various voltage values. Each point of the curve 304 may be obtained by measuring a leakage current after applying each ESD pulse. Thus, for curve 302, the horizontal axis is the ESD voltage across the ESD clamp (e.g., between the source 108 and drain 110), the vertical axis is the ESD current through the ESD clamp. For curve 304, the horizontal axis is the leakage current under 2 Volts across the ESD clamp and the vertical axis represents the ESD pulse current.

The curve 302 has three different sections 302.1, 302.2 and 302.3. The curve 304 has two different sections 304.1 and 304.2. The TLP curve 302 indicates that this ESD clamp has a trigger voltage of about 35 volts. At a low ESD stress (between zero to 35 volts), the curve 302 indicates little or no ESD current flowing through the ESD clamp (e.g., little or no current flowing between the source 108 and the drain 110). And the section 302.1 coincides with the horizontal axis. When the stress voltage reaches an avalanche breakdown value (e.g., 35 volts), the ESD clamp breaks down and the ESD current begins to flow (e.g., the curve 302 enters the section 302.2). Once the ESD current begins, one of the parasitic bipolar transistor is turned on (e.g., the potential difference between the backgate 106 and the source 110 caused by the ESD current may turn on the parasitic bipolar transistor T3). The turning on of the bipolar transistor results in a drop in the ESD stress voltage (e.g., a snapback). During the section 302.2, the ESD current increases and the voltage across the ESD clamp continues to drop until it reaches to about 6~7 volts. Then the ESD clamp has another turning point (e.g., entering the section 302.3). During the section 302.3, the ESD current increases but the ESD stress voltage changes very little.

The curve 304 indicates that when the ESD current is below a threshold (e.g., a failure current level), the leakage current does not change (e.g., section 304.1). Once the ESD current reaches the threshold (e.g., about 650 mA in FIG. 3), the leakage current value increases, which normally means the device is damaged (e.g., section 304.2). Thus, the this protection circuit only provides a ESD protection of up to 650 mA of ESD current. When the ESD current is larger than this threshold, the internal circuitry of the device will be damaged.

The conventional NMOS ESD protection circuit 200 has several shortcomings. For example, the trigger voltage as shown in FIG. 3 is relatively high for this process and there is a risk that internal circuitry may break down at a voltage lower than the trigger voltage of this ESD clamp. Further, because the voltage across the 2 terminals being stressed at the failure current level (about 7 Volts) is much lower than the trigger voltage of the cell, there is a likelihood that only one cell would break down during an ESD stress even if two or more clamp cells were placed in parallel. Because each clamp cell uses certain amount of layout area of an IC, thus, under this situation, although more layout areas of the IC chip are used, the failure current level would not increase but stay the same failure current level of one clamp cell. This is an undesirable characteristic for an ESD clamp cell.

Accordingly, there is a need in the art to design an ESD protection circuit (e.g., a clamp cell, or a breakdown cell) that has a lower trigger voltage than the internal circuitry that it is designed to protect, has a high breakdown failure current level for a given layout area, and the failure current should scale if a number of cells are placed in parallel.

DETAILED DESCRIPTION

In accordance with one embodiment of the present invention, an ESD protection circuit for an integrated circuit chip may comprise an isolated NMOS transistor, which may comprise an isolation region isolating a backgate from a substrate, first and second doped regions and a gate formed on the backgate. The ESD protection circuit further may comprise a first terminal to connect the isolation region to a first electrical node, and a second terminal to connect the second doped region to a second electrical node. The first electrical node may have a higher voltage level than the second electrical node, and the gate and backgate may be coupled to the second terminal.

Figure 1:
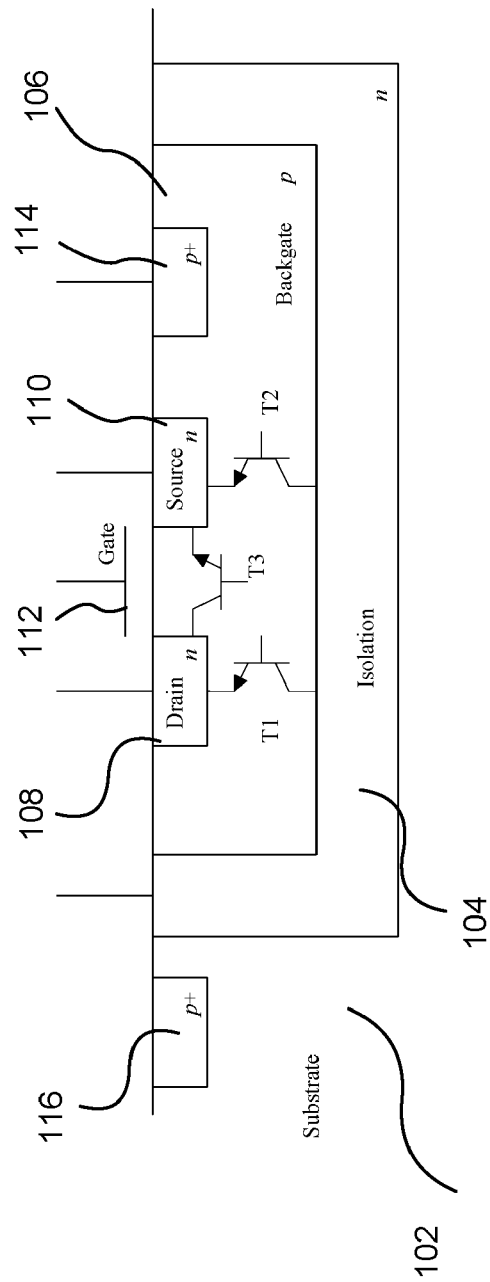
FIG. 1 is a cross sectional view of a conventional NMOS transistor.
Figure 2:
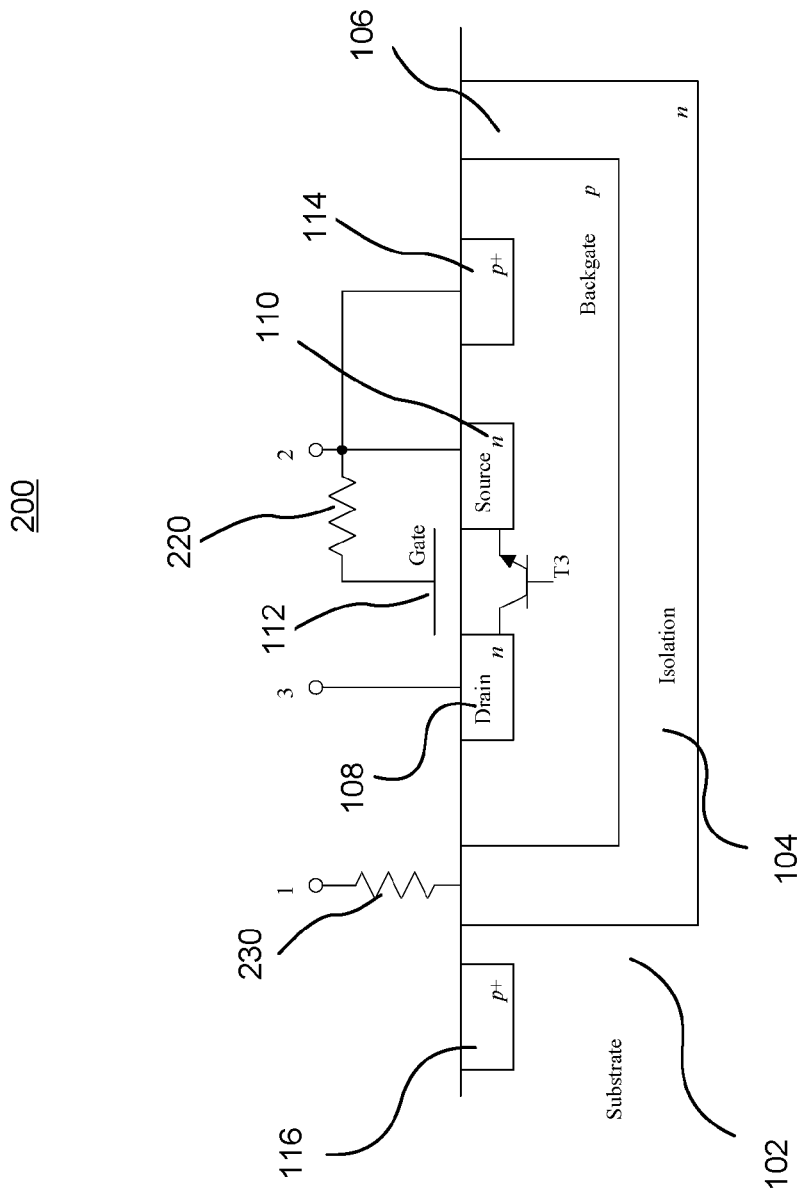
FIG. 2 is cross sectional view of a conventional OFF-NMOS ESD protection circuit.
Figure 4:
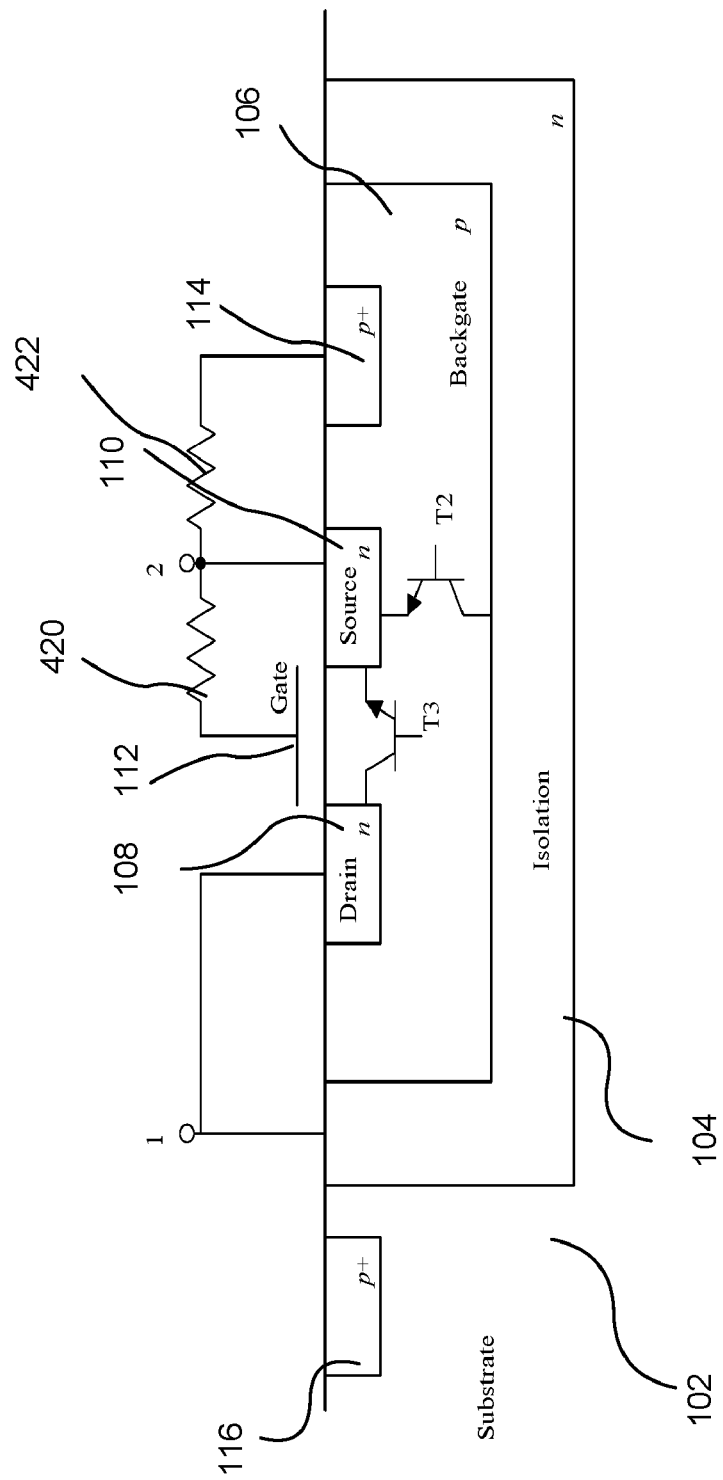
FIG. 4 is a cross sectional view of an isolated OFF-NMOS ESD protection circuit according to an embodiment of the present invention.

Referring to FIG. 4, a cross sectional view of an isolated OFF-NMOS ESD protection circuit 400 according to an embodiment of the present invention is shown. This ESD protection circuit 400 may comprise an isolated NMOS transistor (e.g., as shown in FIG. 1) and two terminals 1 and 2. Both the isolation region 104 and the drain 108 may be connected to the terminal 1. The source 110 may be connected to the terminal 2. Both the gate 112 and the backgate doped region 114 may be coupled to the terminal 2 though resistors 420 and 422 respectively. Terminal 1 may be biased positive with respect to the substrate 102 and terminal 2.

When terminal 1 has an ESD stress that is positive to terminal 2, both the isolation region 104 and the drain 108 may be biased positive with respect to the source 110. If the ESD stress across the drain 108 and the source 110 is strong enough, the parasitic bipolar transistor T3 may enter breakdown mode and conduct ESD current. As described above with respect to FIG. 1, the junction of the drain 108 and the backgate 106 may become reverse biased, and an electron avalanche may be created at this junction. A drifting of holes from the drain 108 towards the backgate 106 may raise the potential of the backgate 106 and make the backgate 106 to the source 110 diode become forward biased. Thus, T3 may enter the snapback state and conduct the ESD current.

In one embodiment, if the ESD stress across the isolation region 104 and the source 110 is strong enough, the parasitic bipolar transistor T2 also may enter breakdown mode and conduct ESD current. For example, the ESD stress across the isolation region 104 and the source 110 may be strong enough to reach a trigger voltage. The junction of the isolation region 104 and the backgate 106 may become reverse biased, and an electron avalanche may be created at this junction. A drifting of holes from the isolation region 104 towards the backgate 106 may raise the potential of the backgate 106 and make the backgate 106 to the source 110 diode become forward biased. Thus, T2 may enter the snapback state and conducts the ESD current. Therefore, in an embodiment, both the parasitic bipolar transistors T2 and T3 may enter breakdown mode and conduct ESD current concurrently. Although T1, T2 and T3 are referred to as transistors, they merely model transistor effects but are not real transistors.

Resistors 420 and 422 may steer current from the gate 112 and the backgate doped region 114 respectively. During an ESD event, ESD current flows between the terminal 1 and terminal 2. Any electric current flowing through the resistors 420 and 422 would raise the potential at the gate 112 and the backgate doped region 114 to be higher than the source 110. Thus, ESD current would be directed to the source 110 (e.g., through T3 and/or T2). In one embodiment, the resistors 420 and 422 may be metal resistors. In another embodiment, they may be made of other suitable conductive material. Further, the resistance of the resistor 422 may be adjusted to change the trigger voltage of the clamp cell. For example, when the resistance of the resistor 422 is low, a large current is needed to flow through the backgate doped region 114 to raise the potential of the backgate 106 and make the backgate 106 to the source 110 diode become forward biased. And the trigger voltage of the clamp cell will be high. When the resistance of the resistor 422 is high, a small current flowing through the backgate doped region 114 will raise the potential of the backgate 106 high enough to make the backgate 106 to the source 110 diode become forward biased. And the trigger voltage of the clamp cell will be low. Therefore, in one embodiment, the resistance value of the resistor 422 is adjustable.

This OFF-NMOS ESD protection circuit 400 may be used between two electrical nodes having different potential levels (e.g., voltage levels) on an IC chip. The terminal 1 may be an electrical node with a voltage level higher than the voltage level of another electrical node (e.g., the terminal 2). In one embodiment, the terminal 1 may be connected to the high potential power supply VDD (e.g., positive (+) 12 volts) and the terminal 2 may be connected to the low potential power supply (e.g., negative (−) 12 volts). In another embodiment, the terminal 1 may be connected to an input or output signal line with a higher voltage level and the terminal 2 may be connected to an input or output signal line with a lower voltage level. In other embodiments, at least one of the terminals may be a conductive region or node of an IC not connected to any external pins.

Figure 3:
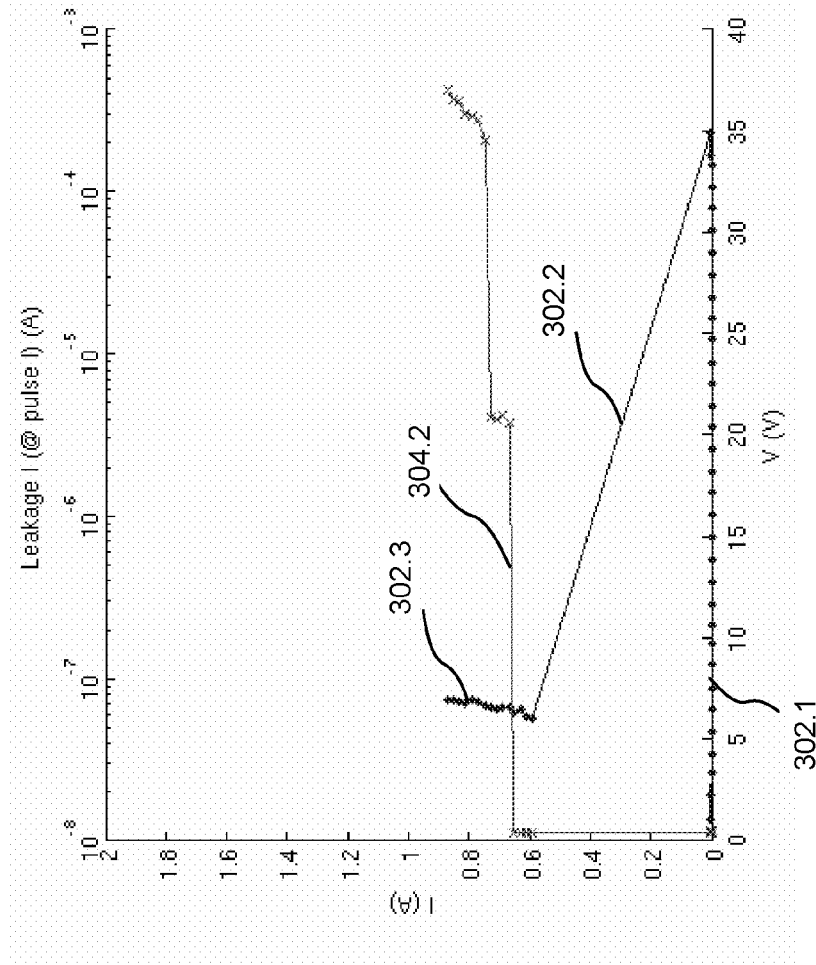
FIG. 3 is graph showing TLP curves of the conventional OFF-NMOS ESD protection circuit shown in FIG. 2.
Figure 5:
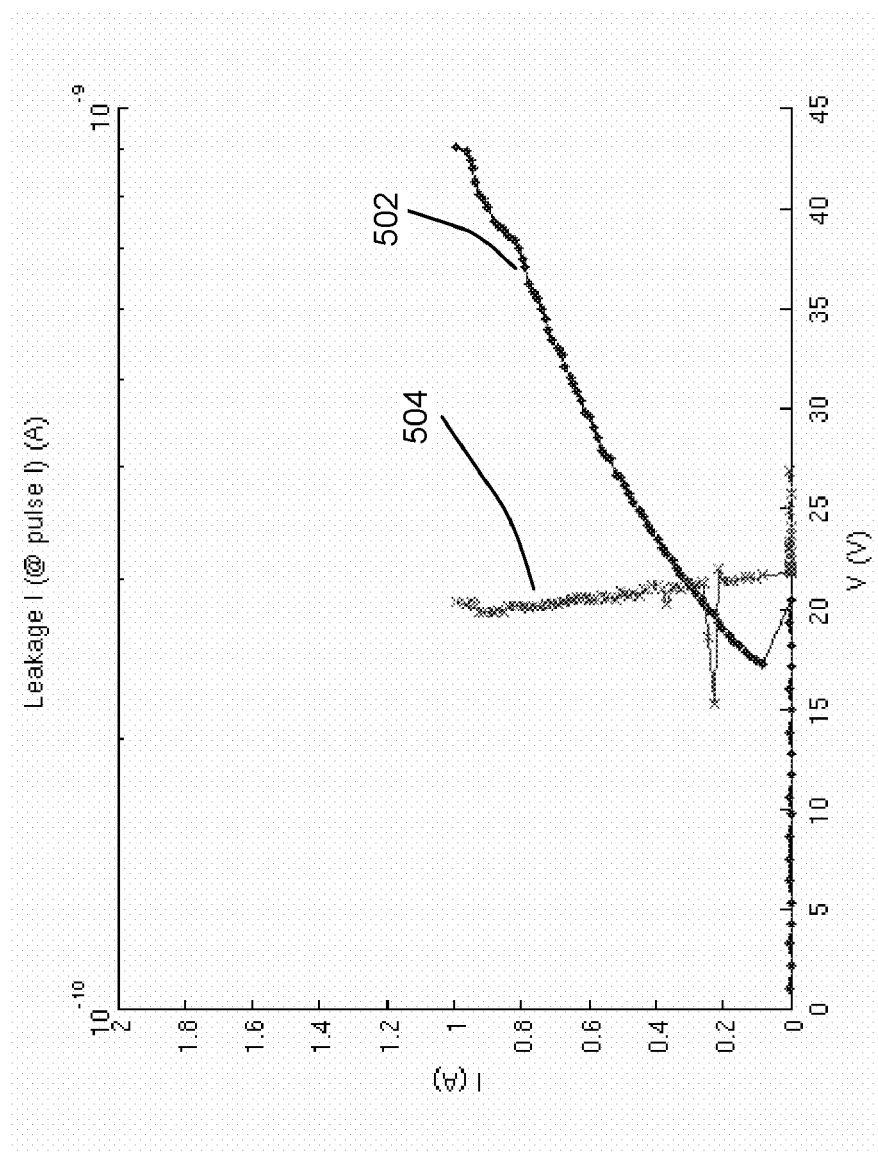
FIG. 5 is graph showing TLP curves of the OFF-NMOS ESD protection circuit shown in FIG. 4.

The TLP curves of the ESD protection circuit 400 are shown in FIG. 5, which includes an I/V curve 502 for ESD pulses and a curve 504 for leakage current after applying ESD pulses. The curve 502 indicates that this ESD clamp has a breakdown trigger voltage of about 21 volts. The trigger voltage 21 volts is less than the operation voltage 24 volts and much less than the trigger voltage 35 volts of a conventional ESD clamp cell shown in FIG. 3. Moreover, the curve 504 indicates a failure current level higher than 1 A, which is much higher than the failure current level 650 mA of the conventional ESD clamp cell shown in FIG. 3.

The ESD protection circuit 400 has another advantage: the ESD performance is scalable with the number of the ESD clamp cells. This can be seen from the TLP results in that the voltage across the 2 terminals being stressed at the failure current level (e.g., greater than 40 V) may be greater than the trigger voltage of the ESD clamp cell (e.g., 21 volts). Thus, any ESD clamp cells being subject to the ESD stress at the failure current level will break down and conduct ESD current. Accordingly, multiple copies of ESD clamps may be put in parallel to provide higher ESD protection (e.g., discharging more static charges).

In one embodiment, the ESD protection circuit 400 may trigger at 21 volts during ESD events that have fast rising time (e.g., during manufacturing, assembly and/or installation).

Figure 6:
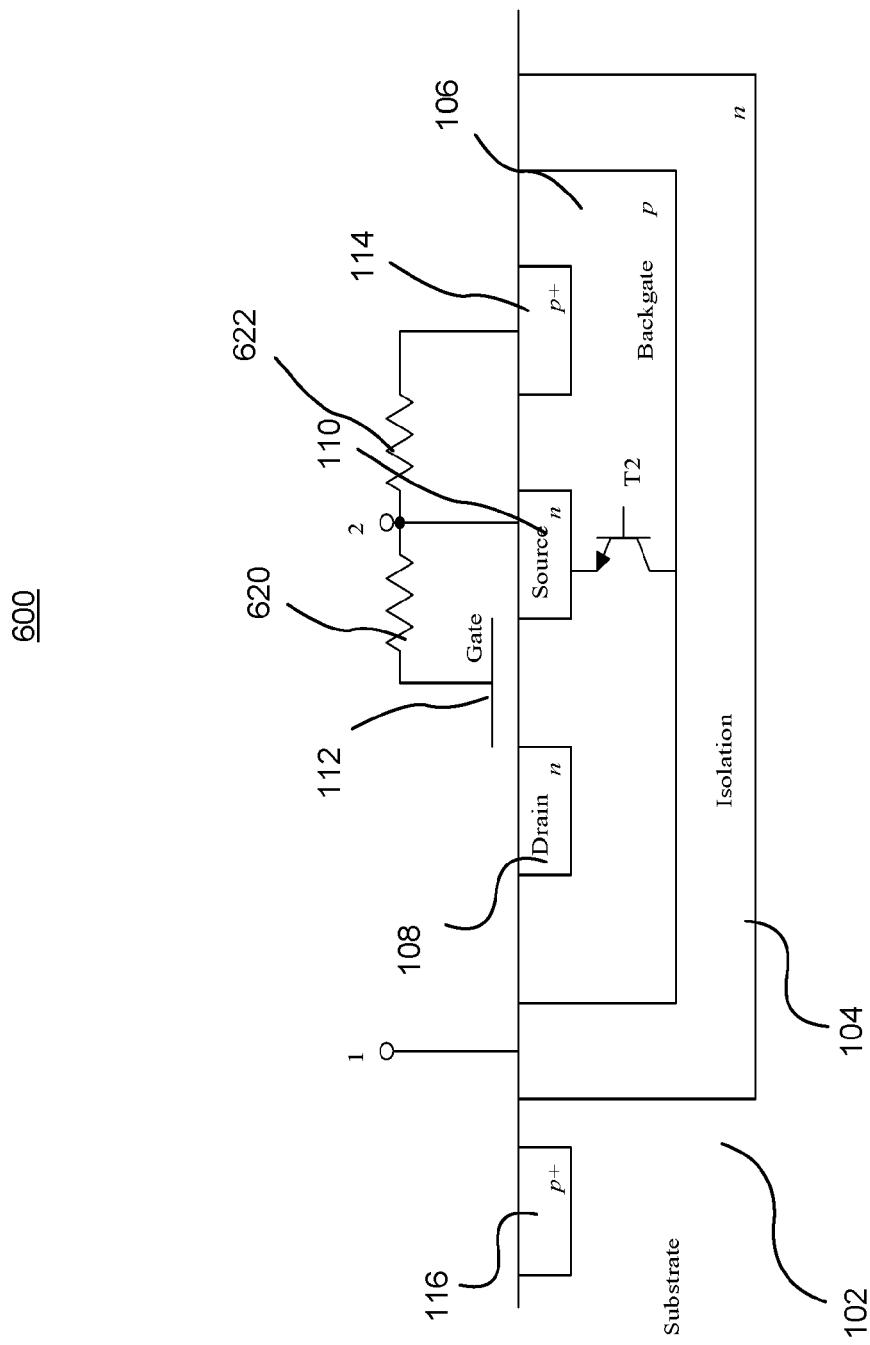
FIG. 6 is a cross sectional view of an isolated OFF-NMOS ESD protection circuit according to an embodiment of the present invention.

Referring to FIG. 6, a cross sectional view of an isolated OFF-NMOS ESD protection circuit 600 according to an embodiment of the present invention is shown. This ESD protection circuit 600 comprises an isolated NMOS transistor (e.g., as shown in FIG. 1) and two terminals 1 and 2. In contrast to the ESD protection circuit 400 shown in FIG. 4, only isolation region 104 is connected to the terminal 1. The source 110 may be connected to the terminal 2. Both the gate 112 and the backgate doped region 114 may be coupled to the terminal 2 though resistors 620 and 622 respectively (e.g., similar to resistors 420 and 422 of FIG. 4). The resistors 620 and 622 (e.g., metal or other conductive material) may steer current away from the gate 112 and the backgate doped region 114, and guide current to the source 110 similarly as resistors 420 and 422 of FIG. 4. In one embodiment, the resistor 622 has an adjustable resistance value to adjust the clamp cell trigger voltage. Terminal 1 may be biased positive with respect to the substrate 102 and terminal 2.

When terminal 1 has an ESD stress that is positive to terminal 2, the isolation region 104 is biased positive with respect to the source 110. If the ESD stress across the isolation region 104 and the source 110 is strong enough, the parasitic bipolar transistor T2 may enter breakdown mode and conduct ESD current. For example, the ESD stress across the isolation region 104 and the source 110 may be strong enough to reach a trigger voltage. The junction of the isolation region 104 and the backgate 106 may become reverse biased, and an electron avalanche is created at this junction. A drifting of holes from the isolation region 104 towards the backgate 106 raises the potential of the backgate 106 and makes the backgate 106 to the source 110 diode become forward biased. Thus, T2 enters the snapback state and conducts the ESD current.

This OFF-NMOS ESD protection circuit 600 may be used between two electrical nodes having different potential levels (e.g., voltage levels) on an IC chip. The terminal 1 may be an electrical node with a voltage level higher than the voltage level of another electrical node—the terminal 2. In one embodiment, the electrical nodes may be connected to external pins. For example, the terminal 1 may be connected to the high potential power supply VDD (e.g., positive (+) 12 volts) and the terminal 2 may be connected to the low potential power supply (e.g., negative (−) 12 volts). In another embodiment, the terminal 1 may be connected to an input or output signal line with a higher voltage level and the terminal 2 may be connected to an input or output signal line with a lower voltage level. In other embodiments, at least one of the electrical nodes may be a conductive region or node of an IC not connected to any external pins.

Figure 7:
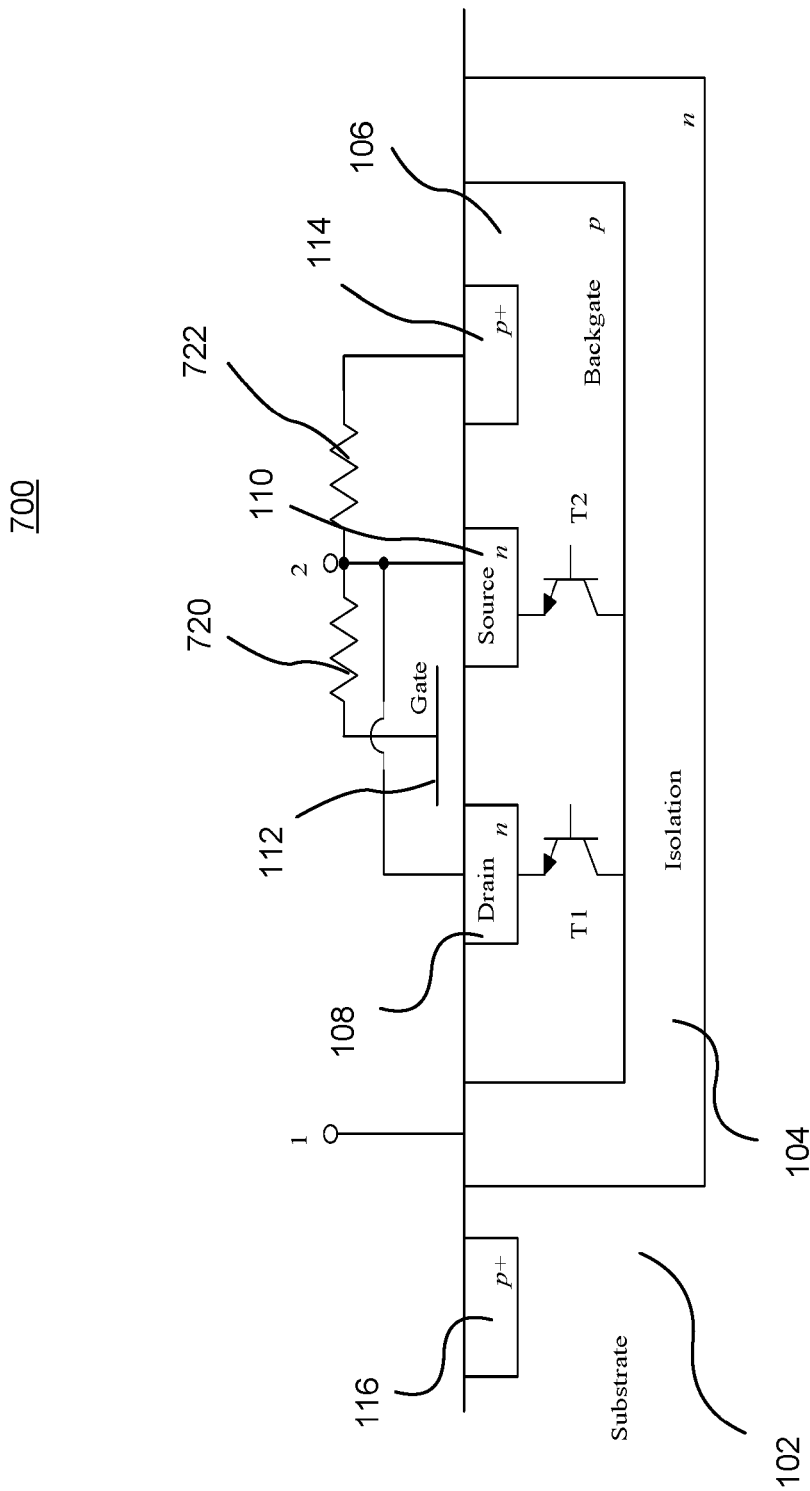
FIG. 7 is a cross sectional view of an isolated OFF-NMOS ESD protection circuit according to an embodiment of the present invention.

Referring to FIG. 7, a cross sectional view of an isolated OFF-NMOS ESD protection circuit 700 according to an embodiment of the present invention is shown. This ESD protection circuit 700 comprises an isolated NMOS transistor (e.g., as shown in FIG. 1) and two terminals 1 and 2. In contrast to the ESD protection circuit 400 shown in FIG. 4, only isolation region 104 is connected to the terminal 1 but both the drain 108 and the source 110 are connected to the terminal 2. Both the gate 112 and the backgate doped region 114 are coupled to the terminal 2 though resistors 720 and 722 respectively (e.g., similar to resistors 420 and 422 of FIG. 4). The resistors 720 and 722 (e.g., metal or other conductive material) may steer current away from the gate 112 and the backgate doped region 114, and guide current to the source 110 similarly as resistors 420 and 422 of FIG. 4. However, because the drain 108 is connected to the source 110, there is no potential difference between the two regions. As described below, ESD Current would also be guided to the drain 108. In one embodiment, the resistor 722 has an adjustable resistance value to adjust the clamp cell trigger voltage. Terminal 1 may be biased positive with respect to the substrate 102 and terminal 2.

When terminal 1 has an ESD stress that is positive to terminal 2, the isolation region 104 is biased positive with respect to both the drain 108 and source 110. If the ESD stress across the isolation region 104 and the source 110 is strong enough, the parasitic bipolar transistor T2 may enter breakdown mode and conduct ESD current. Moreover, because the source 110 and drain 108 are kept at the same potential, the ESD stress may also cause the transistor T1 to break down. For example, the ESD stress across the isolation region 104 and the drain 108 may be strong enough to also reach a trigger voltage. The junction of the isolation region 104 and the backgate 106 may become reverse biased, and an electron avalanche is created at this junction. A drifting of holes from the isolation region 104 towards the backgate 106 raises the potential of the backgate 106 and makes the backgate 106 to the drain 108 diode become forward biased. Thus, T1 also enters the snapback state and conducts the ESD current. Therefore, in an embodiment, both the parasitic bipolar transistors T1 and T2 may enter breakdown mode and conduct ESD current concurrently.

This OFF-NMOS ESD protection circuit 700 may be used between two electrical nodes having different potential levels (e.g., voltage levels) on an IC chip. The terminal 1 may be an electrical node with a voltage level higher than the voltage level of another electrical node—the terminal 2. In one embodiment, the electrical nodes may be connected to external pins. For example, the terminal 1 may be connected to the high potential power supply VDD (e.g., positive (+) 12 volts) and the terminal 2 may be connected to the low potential power supply (e.g., negative (−) 12 volts). In another embodiment, the terminal 1 may be connected to an input or output signal line with a higher voltage level and the terminal 2 may be connected to an input or output signal line with a lower voltage level. In other embodiments, at least one of the electrical nodes may be a conductive region or node of an IC not connected to any external pins.

Figure 8:
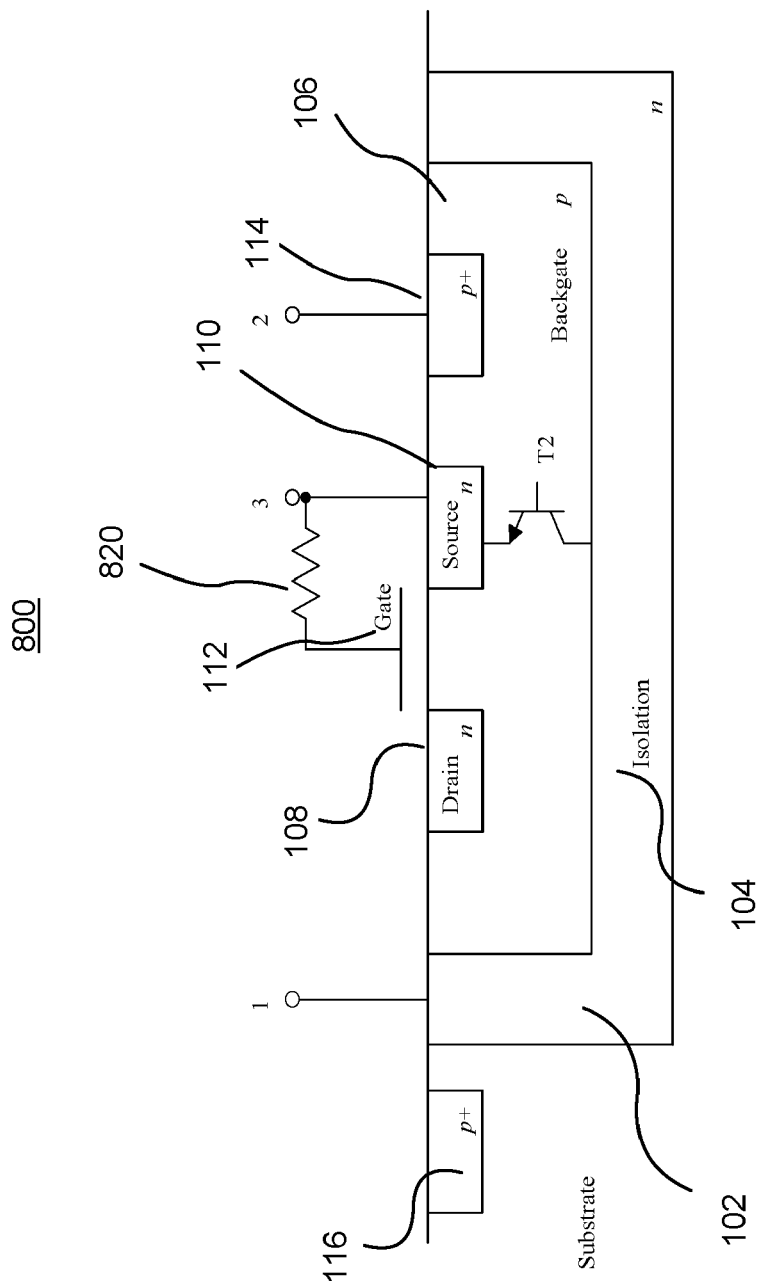
FIG. 8 is a cross sectional view of an isolated OFF-NMOS ESD protection circuit according to an embodiment of the present invention.

Referring to FIG. 8, a cross sectional view of an isolated OFF-NMOS ESD protection circuit 800 according to an embodiment of the present invention is shown. This ESD protection circuit 800 comprises an isolated NMOS (e.g., as shown in FIG. 1) and three terminals 1, 2 and 3. In one embodiment, the isolation region 104 is connected to the terminal 1, the backgate doped region 114 is connected to the terminal 2 and the source 110 is connected to the terminal 3. The gate 112 is coupled to the terminal 3 though a resistor 820. The resistor 820 may be made of metal or other conductive material and may steer current away from the gate 112 during an ESD event.

When terminal 1 has an ESD stress that is positive to terminal 3, the isolation region 104 is biased positive with respect to the source 110. If the ESD stress across the isolation region 104 and the source 110 is strong enough, the parasitic bipolar transistor T2 may enter breakdown mode and conduct ESD current. During this ESD event, no current is flowing to the terminal 2 and the backgate 106 becomes a floating base for the transistor T2. In one embodiment, the ESD protection circuit 800 has a lower trigger voltage than the ESD protection circuits 400, 600 and 700 shown in FIGS. 4, 6-7.

This OFF-NMOS ESD protection circuit 800 may be used between three electrical nodes having different potential levels (e.g., voltage levels) on an IC chip. The terminal 1 may be an electrical node with a voltage level higher than the voltage level of another electrical node—the terminal 3, and terminal 3 has a higher voltage level than the third electrical node: terminal 2. In one embodiment, the electrical nodes may be connected to external pins. For example, the terminal 1 may be connected to the high potential power supply VDD (e.g., positive (+) 12 volts), the terminal 3 may be connected to the mid potential power supply and terminal 2 may be connected to a low potential power supply (e.g., negative (−) 12 volts). In another embodiment, the terminal 1 may be connected to an input or output signal line with a high voltage level, the terminal 3 may be connected to an input or output signal line with a mid voltage level and the terminal 2 may be connected to an input or output signal line with a low voltage level. In other embodiments, at least one of the electrical nodes may be a conductive region or node of an IC not connected to any external pins.

Figure 9:
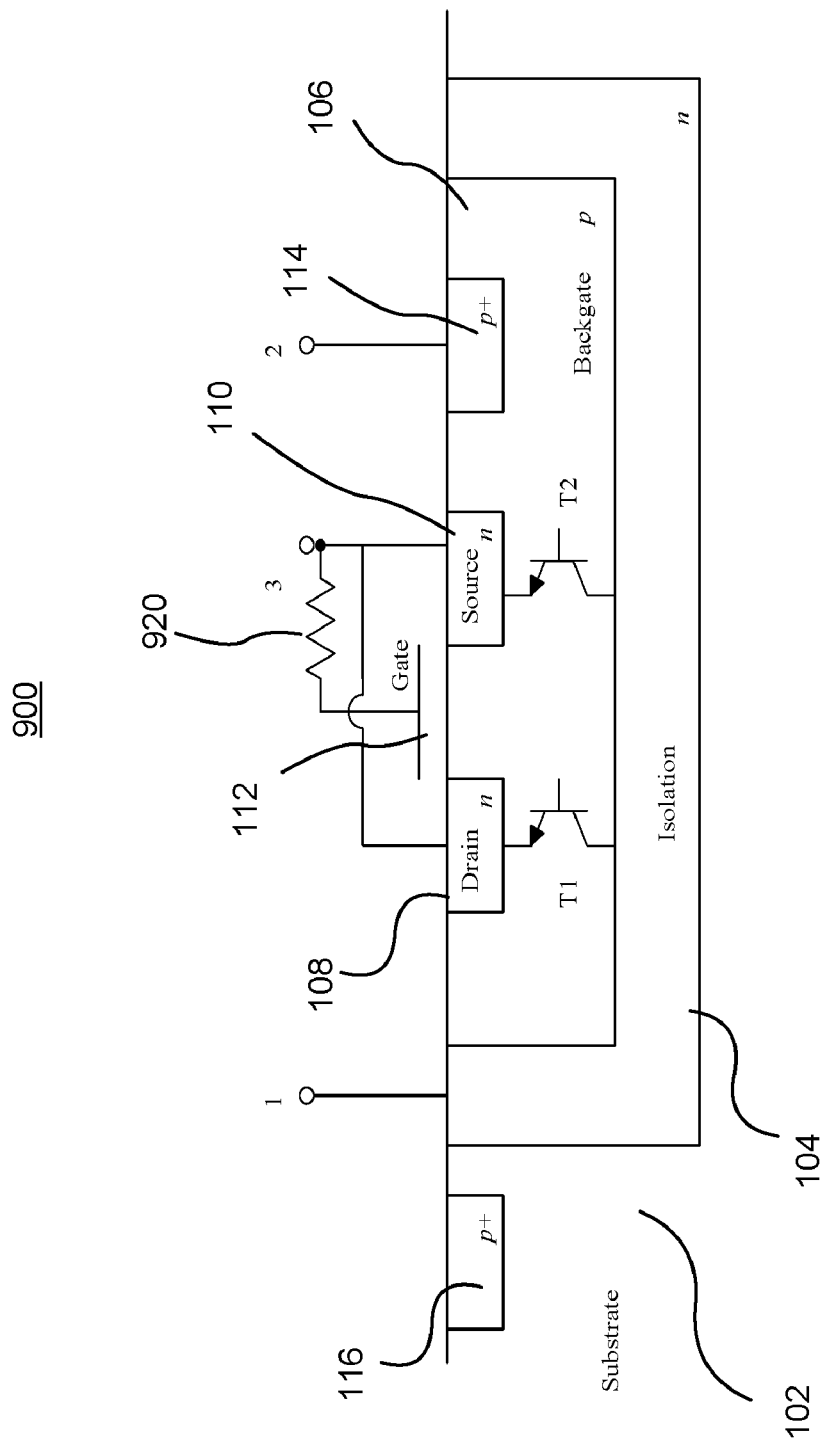
FIG. 9 is a cross sectional view of an isolated OFF-NMOS ESD protection circuit according to an embodiment of the present invention.

Referring to FIG. 9, this ESD clamp C5 is used to connect two power supplies. Terminal 1 is the isolation connected to the high potential power supply, terminal 3 is the drain and the source connected to the mid potential power supply, and terminal 2 is the backgate connected to the low potential power supply. During ESD events with terminal 1 stressed positive to terminal 3, the floating-base transistors T1 and T2 may break down.

Referring to FIG. 9, a cross sectional view of an isolated OFF-NMOS ESD protection circuit 900 according to an embodiment of the present invention is shown. This ESD protection circuit 900 comprises an isolated NMOS transistor (e.g., as shown in FIG. 1) and three terminals 1, 2 and 3. In one embodiment, the isolation region 104 is connected to the terminal 1, the backgate doped region 114 is connected to the terminal 2, both of the drain 108 and the source 110 are connected to the terminal 3. The gate 112 is coupled to the terminal 3 though a resistor 920. The resistor 920 may be made of metal or other conductive material and may steer current away from the gate 112 during an ESD event.

When terminal 1 has an ESD stress that is positive to terminal 3, the isolation region 104 is biased positive with respect to both the drain 108 and source 110. If the ESD stress across the isolation region 104 and the source 110 is strong enough, the parasitic bipolar transistor T2 may enter breakdown mode and conduct ESD current. Moreover, because the source 110 and drain 108 are kept at the same potential, the ESD stress may also cause the transistor T1 to break down. For example, the ESD stress across the isolation region 104 and the drain 108 may be strong enough to also reach a trigger voltage. The junction of the isolation region 104 and the backgate 106 may become reverse biased, and an electron avalanche is created at this junction. A drifting of holes from the isolation region 104 towards the backgate 106 raises the potential of the backgate 106 and makes the backgate 106 to the drain 108 diode become forward biased. Thus, T1 also enters the snapback state and conducts the ESD current. Therefore, in an embodiment, both the parasitic bipolar transistors T1 and T2 may enter breakdown mode and conduct ESD current concurrently. During an ESD event between the terminals 1 and 3, no current is flowing to the terminal 2 and the backgate 106 becomes a floating base for both of the transistors T1 and T2.

This OFF-NMOS ESD protection circuit 900 may be used between three electrical nodes having different potential levels (e.g., voltage levels) on an IC chip. The terminal 1 may be an electrical node with a voltage level higher than the voltage level of another electrical node—the terminal 3, and terminal 3 has a higher voltage level than the third electrical node: terminal 2. In one embodiment, the electrical nodes may be connected to external pins. For example, the terminal 1 may be connected to the high potential power supply VDD (e.g., positive (+) 12 volts), the terminal 3 may be connected to the mid potential power supply and terminal 2 may be connected to a low potential power supply (e.g., negative (−) 12 volts). In another embodiment, the terminal 1 may be connected to an input or output signal line with a high voltage level, the terminal 3 may be connected to an input or output signal line with a mid voltage level and the terminal 2 may be connected to an input or output signal line with a low voltage level. In other embodiments, at least one of the electrical nodes may be a conductive region or node of an IC not connected to any external pins.

Figure 10:
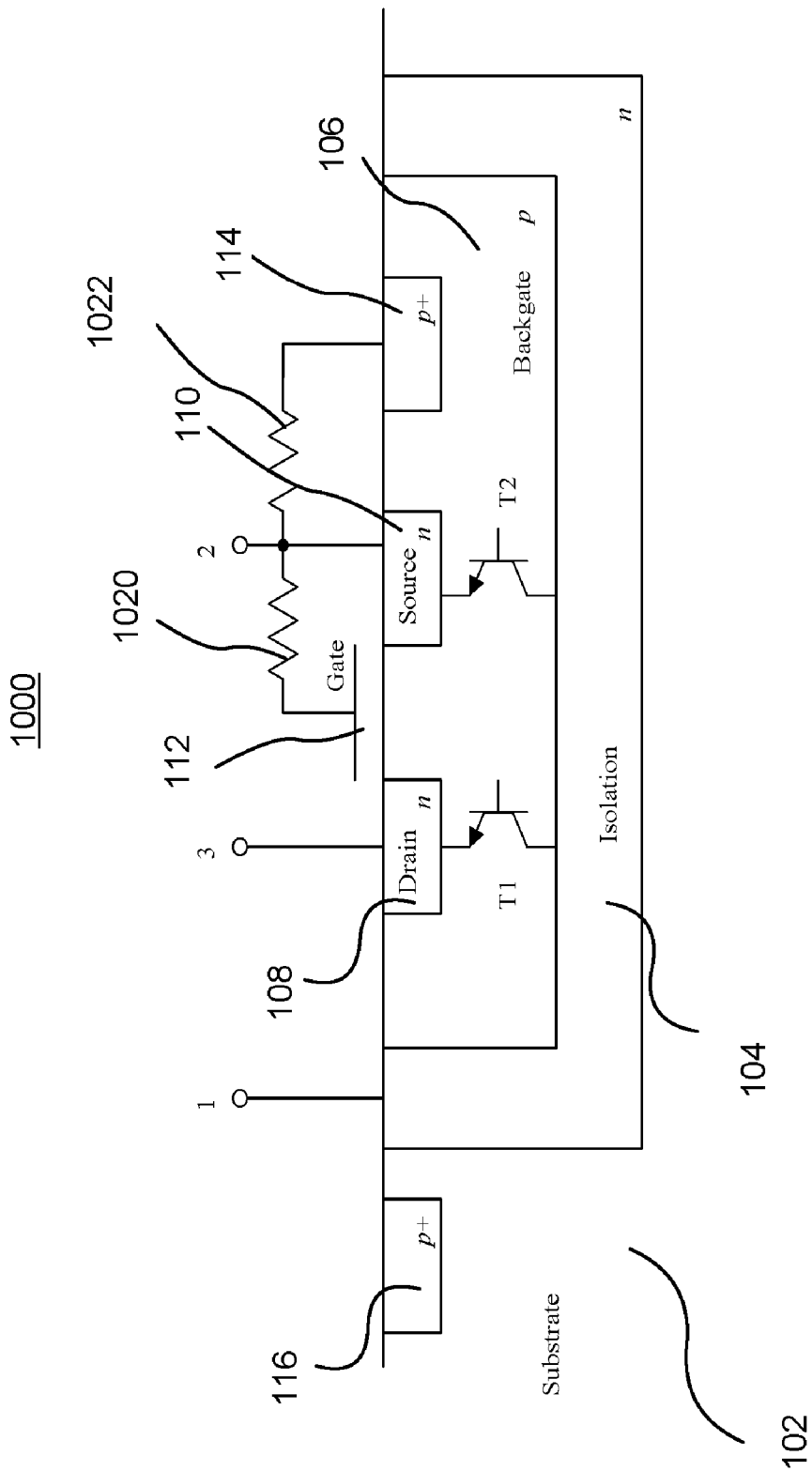
FIG. 10 is a cross sectional view of an isolated OFF-NMOS ESD protection circuit according to an embodiment of the present invention.

Referring to FIG. 10, this ESD clamp C6 is able to connect three power supplies and acts as one ESD clamp between terminal 1 and 3 and the other between terminal 1 and 2. Terminal 1 is the isolation connected to the high potential power supply, terminal 3 is the drain connected to the mid potential power supply, and terminal 2 is the source connected to the low potential power supply. Gate and backgate are coupled to terminal 2 through resistors or metal. During ESD events with terminal 1 stressed positive to terminal 2, this ESD clamp acts like C1. During ESD events with terminal 1 stressed positive to terminal 3, this ESD clamp acts like C4.

Referring to FIG. 10, a cross sectional view of an isolated OFF-NMOS ESD protection circuit 1000 according to an embodiment of the present invention is shown. This ESD protection circuit 1000 comprises an isolated NMOS transistor (e.g., as shown in FIG. 1) and three terminals 1, 2 and 3. In one embodiment, the isolation region 104 is connected to the terminal 1, the drain 108 is connected to the terminal 2, and the source 110 is connected to the terminal 3. Both the gate 112 and the backgate doped region 114 are coupled to the terminal 2 though resistors 1020 and 1022 respectively.

The ESD protection circuit 1000 may act as two ESD clamp cells: one between the terminals 1 and 2, another between terminals 1 and 3. When terminal 1 has an ESD stress that is positive to terminal 2, the isolation region 104 is biased positive with respect to the source 110. If the ESD stress across the isolation region 104 and the source 110 is strong enough, the parasitic bipolar transistor T2 may enter breakdown mode and conduct ESD current. During this ESD event, the resistors 1020 and 1022 (e.g., metal or other conductive material) may steer current away from the gate 112 and the backgate doped region 114, and guide current to the source 110. Also, during this ESD event, no current is flowing to the terminal 3 and the backgate 106 becomes a floating base for the transistor T2. In one embodiment, the resistor 1022 has an adjustable resistance value to adjust the clamp cell trigger voltage.

When terminal 1 has an ESD stress that is positive to terminal 3, the ESD stress may also cause the transistor T1 to break down. For example, the ESD stress across the isolation region 104 and the drain 108 may be strong enough to also reach a trigger voltage. The junction of the isolation region 104 and the backgate 106 may become reverse biased, and an electron avalanche is created at this junction. A drifting of holes from the isolation region 104 towards the backgate 106 raises the potential of the backgate 106 and makes the backgate 106 to the drain 108 diode become forward biased. Thus, T1 also enters the snapback state and conducts the ESD current. Also, during this ESD event, no current is flowing to the terminal 2 and the backgate 106 becomes a floating base for the transistor T1.

This OFF-NMOS ESD protection circuit 1000 may be used between three electrical nodes having different potential levels (e.g., voltage levels) on an IC chip. The terminal 1 may be an electrical node with a voltage level higher than the voltage level of another electrical node—the terminal 3, and terminal 3 has a higher voltage level than the third electrical node: terminal 2. In one embodiment, the electrical nodes may be connected to external pins. For example, the terminal 1 may be connected to the high potential power supply VDD (e.g., positive (+) 12 volts), the terminal 3 may be connected to the mid potential power supply and terminal 2 may be connected to a low potential power supply (e.g., negative (−) 12 volts). In another embodiment, the terminal 1 may be connected to an input or output signal line with a high voltage level, the terminal 3 may be connected to an input or output signal line with a mid voltage level and the terminal 2 may be connected to an input or output signal line with a low voltage level. In other embodiments, at least one of the electrical nodes may be conductive region or nodes of an IC not connected to any external pins.

ESD protection circuits shown in FIGS. 6-10 provide similar ESD performance as the ESD protection circuit 400 shown in FIG. 4. The TLP curves of ESD protection circuits in FIGS. 6-10 are not shown but they are similar to the performance of the ESD protection circuit 400 shown in FIG. 5. Accordingly, the ESD protection circuits shown in FIGS. 6-10 have similar characteristics: breakdown trigger voltages less than the operation voltage and failure current levels higher than the failure current level 650 mA of the conventional ESD clamp cell shown in FIG. 3. Moreover, their ESD performance is scalable with the number of the ESD clamp cells. That is: the voltage across the 2 terminals being stressed at the failure current level is greater than the trigger voltage of the ESD clamp cell, thus, any ESD clamp cells being subject to the ESD stress at the failure current level will break down and conduct ESD current. Accordingly, multiple copies of embodiments of the present invention may be put in parallel to provide higher ESD protection (e.g., discharging more static charges).

Embodiments of ESD protection circuits in accordance with the present invention make use only of the isolated NMOS transistor and do not require the semiconductor process to support bipolar transistor types. Furthermore these embodiments always have the isolation layer biased to the higher of the supply voltages being connected to the protection circuit. Accordingly, the ESD breakdowns taking place from either the source or drain terminals of the isolated NMOS device being taken positive with respect to the isolation layer can easily be prevented with ESD diodes that are placed external to the isolated NMOS transistor. Thus, the ESD breakdown of a clamp cell is limited to ESD stresses in which the isolation layer is stressed positive with respect to either the source or drain of the isolated NMOS device.

Embodiments of the present invention take advantage of the parasitic bipolar transistors of an isolated NMOS transistor having different collectors, emitters and bases. These bipolar transistors show different characteristics such as trigger voltage and break down current level. In the FIGS. 4 and 6-10, the drain and the source are drawn as identical but this need not be the case. Further, the semiconductor processing of the drain need not be identical to that of the source. In one embodiment, the isolated NMOS transistor may be symmetrical, the drain 108 and the source 110 may be interchangeable. The transistors (e.g., T1, T2 and T3) illustrated in these figures are physical and/or electrical effects of various neighboring regions of an IC ship. They model operations of transistors but are not individual transistor devices.

Figure 11:
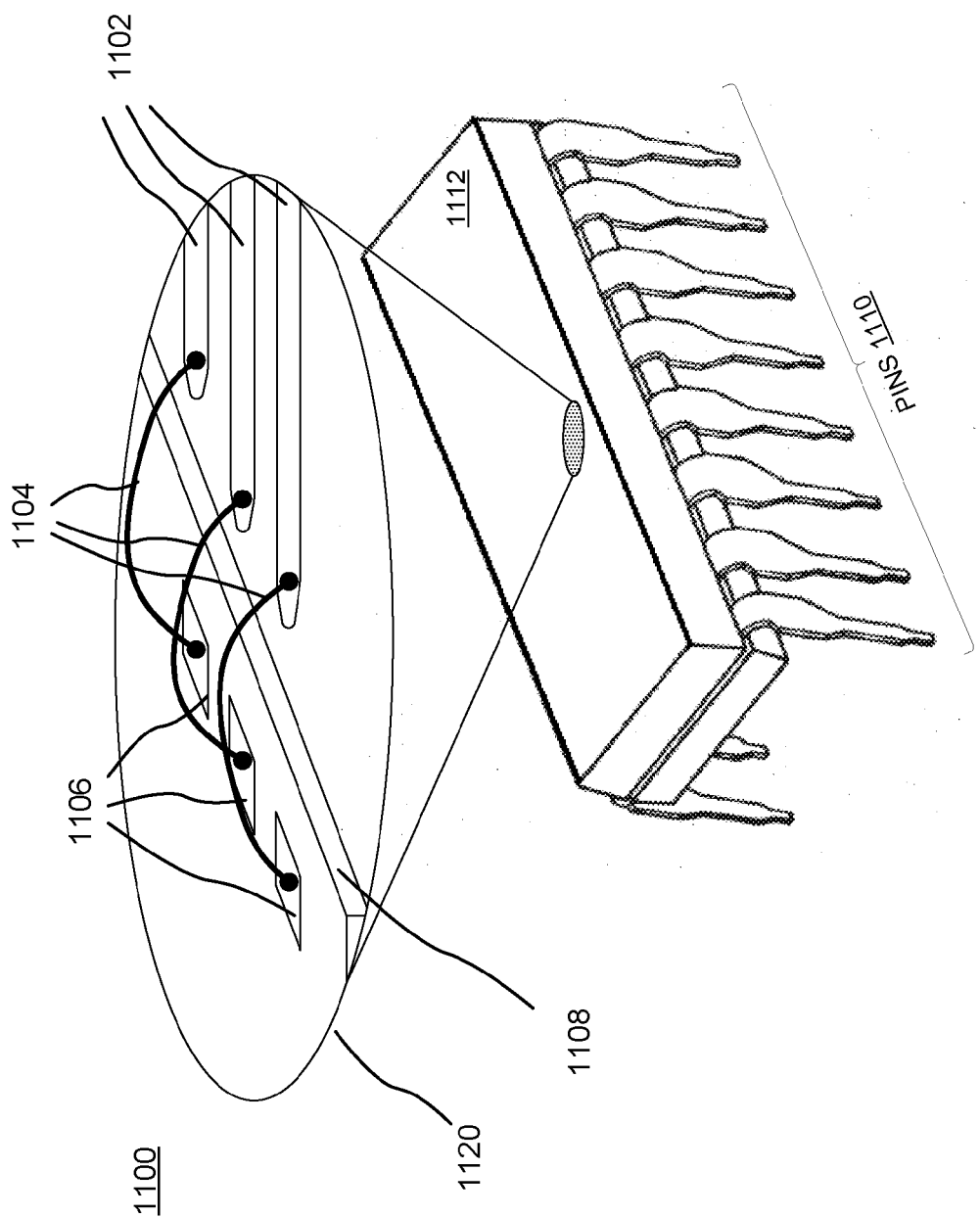
FIG. 11 illustrates an IC chip with an isolated OFF-NMOS ESD protection circuit according to an embodiment of the present invention.

FIG. 11 illustrates an IC chip 1100 with an isolated OFF-NMOS ESD protection circuit according to an embodiment of the present invention. The chip 1100 may comprise a chip package 1120, which may be include a casing (typically, plastic) with electrical contact pins 1110.1-1110.N extending out of it. Inside, as shown in the enlarged view 1120 the pins 1110.1-1110.N are connected to metal traces that extend to a position adjacent to a semiconductor die 1108. Thin wires 1104 may connect the traces 1102 to metal contact pads 1106 on the integrated circuit die 1108. Within the integrated circuit die, receiver circuits (not shown) may be provided in electrical connection to the contact pads 1106 to receive external signals input to the chip 1100 via the pins 1110. A variety of circuit designs are known for use as receiver circuits. Commonly the receiver circuits are composed of a variety of transistors. According to an embodiment, the receivers may have different voltage levels and may employ isolated OFF-NMOS ESD protection circuits as disclosed in the foregoing embodiments.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. An ESD protection circuit for an integrated circuit chip, comprising:
   an isolated NMOS transistor comprising:
      an isolation region isolating a backgate from a substrate, and
      a first and second doped regions and a gate formed on the backgate;
   a first terminal to connect the isolation region to a first electrical node; and
   a second terminal to connect the second doped region to a second electrical node, wherein the first electrical node has a higher voltage level than the second electrical node, and the gate and backgate are coupled to the second terminal, wherein the backgate is coupled to the second terminal via a discrete resistor formed separate from internal body resistance of the transistor.

2. The ESD protection circuit of claim 1, wherein the first doped region is a drain and the second doped region is a source of the isolated NMOS transistor.

3. The ESD protection circuit of claim 2, wherein the isolated MOS transistor is off during operation of the integrated circuit chip.

4. The ESD protection circuit of claim 2, wherein the drain is not connected to any terminal and is floating.

5. The ESD protection circuit of claim 2, wherein the drain is connected to the first terminal and the isolation region.

6. The ESD protection circuit of claim 2, wherein the drain is connected to the second terminal and the source.

7. The ESD protection circuit of claim 2, wherein the backgate is to be coupled to the second terminal via a backgate doped region.

8. The ESD protection circuit of claim 1, wherein the discrete resistor has an adjustable resistance.

9. The ESD protection circuit of claim 1, wherein the first electrical node is a first power supply of a high voltage level and the second electrical node is a second power supply of a lower voltage level.

10. The ESD protection circuit of claim 1, further comprising:
    a second isolated NMOS transistor connected in parallel to the NMOS transistor between the first and second electrical nodes, the second isolated NMOS transistor comprising:
       a second isolation region isolating a second backgate from a second substrate, the second isolating region being connected to the first electrical node, and
       a third and fourth doped regions and a second gate formed on the second backgate, the fourth doped region being connected to the second electrical node, wherein the second gate and second backgate are coupled to the second electrical node, the second backgate is coupled to the second electrical node via a second resistor and the second resistor is a discrete resistor formed separate from internal body resistance of the transistor.

* * * * *